United States Patent [19]

Matias et al.

[11] Patent Number: 5,703,581
[45] Date of Patent: Dec. 30, 1997

[54] METHOD AND APPARATUS FOR DATA COMPRESSION AND DECOMPRESSION

[75] Inventors: Yossi Matias, Potomac; Suleyman Cenk Sahinalp, Greenbelt, both of Md.

[73] Assignee: Lucent Technologies Inc., Murray Hill, N.J.

[21] Appl. No.: 665,188

[22] Filed: Jun. 14, 1996

[51] Int. Cl.⁶ ........................................... H03M 7/40
[52] U.S. Cl. ............................................... 341/67
[58] Field of Search ........................... 341/67, 50, 51, 341/87; 364/514 R; 395/800, 602

[56] References Cited

U.S. PATENT DOCUMENTS

| | | | |
|---|---|---|---|
| 4,464,650 | 8/1984 | Eastman et al. | 340/347 |
| 4,558,302 | 12/1985 | Welch | 340/347 |
| 5,477,550 | 12/1995 | Crisler et al. | 371/32 |
| 5,623,423 | 4/1997 | Lipovski | 364/514 |

OTHER PUBLICATIONS

J. Ziv, et al. "Compression of Individual Sequences via Variable–Rate Coding" *IEEE Transactions On Information Theory*, vol. IT–24, No. 5, pp. 530–536 (1978).

T. A. Welch, "A Technique For High–Performance Data Compression", *Computer* pp. 8–19, (1984).

J. Ziv. et al. "A Universal Algorithm for Sequential Data compression", *IEEE Transactions on Information Theory*, vol. IT–23, No. 3 pp. 337–343, (1977).

D. Lelewer, et al. "Data Compression" ACM Computer Surveys (1987).

D. A. Huffman, "A Method for the Construction of Minimum Redundancy Codes", *Proceedings IRE*, vol. 40, No. 10, pp. 1098–1100 (1978).

*Primary Examiner*—Brian K. Young
*Attorney, Agent, or Firm*—Robert E. Rudnick

[57] ABSTRACT

A data compression technique for encoding a data stream of symbols processes a current sequence of symbols in the stream using an adaptive look-up table containing strings of different lengths by identifying whether a match of a longest string from the table or a shorter string would produce a lower compression ratio by "looking ahead" and identifying a match between a next sequence in the data stream and strings in the table. The compression technique identifies those situations where it is advantageous to use a compressed code identifier for a current sequence that is shorter than the longest matching sequence. Such situations exist when the compression ratio achieved for compressing the current sequence in combination with the next sequence in the stream is greater when other than the longest match is employed for the first sequence. A corresponding decompression technique to decode data encoded using a similar "look ahead" technique is also disclosed.

21 Claims, 7 Drawing Sheets

FIRST ITERATION
I=0      TABLE ⎡ a=0 ⎤
J=0            ⎣ b=1 ⎦
J′=0
M=0      COMPRESSED OUTPUT COMP_CODES={EMPTY-STRING}
         NEXT ENTRY FOR TABLE= "ab" FOR DATA[0:1]

FIG. 5B

SECOND ITERATION
I=0      TABLE ⎡ a=0  ⎤
J=0            ⎢ b=1  ⎥
J′=0           ⎣ ab=2 ⎦
M=1      COMPRESSED OUTPUT COMP_CODES=0 FOR DATA[0:0]="a"
         NEXT ENTRY FOR TABLE= "ba" FOR DATA[1:2]

FIG. 5C

THIRD ITERATION
I=1      TABLE ⎡ a=0  ⎤
J=2            ⎢ b=1  ⎥
J′=1           ⎢ ab=2 ⎥
M=2            ⎣ ba=3 ⎦

COMP_CODES=01
         NEXT ENTRY FOR TABLE="aba" FOR DATA[1:2]

FIG. 5D

FOURTH ITERATION
I=2      TABLE ⎡ a=0  ⎤
J=4            ⎢ b=1  ⎥
J′=2           ⎢ ab=2 ⎥
M=4            ⎢ ba=3 ⎥
               ⎣ aba=4⎦

COMP_CODES= 0 1 2
         NEXT ENTRY FOR TABLE="abaa" FOR DATA[4:7]

FIG. 5E
FIFTH ITERATION

I=4  
J=7  
J'=4  
M=7

TABLE $\begin{bmatrix} a=0 \\ b=1 \\ ab=2 \\ ba=3 \\ aba=4 \\ abaa=5 \end{bmatrix}$ COMP_CODES= 0 1 2 4

NEXT ENTRY FOR TABLE="abab" FOR DATA[7:11]

FIG. 5F
SIXTH ITERATION

I=7  
J=11  
J'=7  
M=12

TABLE $\begin{bmatrix} a=0 \\ b=1 \\ ab=2 \\ ba=3 \\ aba=4 \\ abaa=5 \\ abaab=6 \end{bmatrix}$ COMP_CODES= 0 1 2 4 4

NEXT ENTRY FOR TABLE="baa" FOR DATA[11:13]

FIG. 5G
SEVENTH ITERATION

I=10  
J=13  
J'=11  
M=13

TABLE $\begin{bmatrix} a=0 \\ b=1 \\ ab=2 \\ ba=3 \\ aba=4 \\ abaa=5 \\ abaab=6 \\ baa=7 \end{bmatrix}$ COMP_CODES= 0 1 2 4 4

NO COMPRESSED SYMBOL ADDED TO COMP_CODES  
NEXT ENTRY FOR TABLE="aa" FOR DATA[13:14]

FIG. 5H
EIGHTH ITERATION

I=10  
J=14  
J'=13  
M=14

TABLE $\begin{bmatrix} a=0 \\ b=1 \\ ab=2 \\ ba=3 \\ aba=4 \\ abaa=5 \\ abaab=6 \\ baa=7 \\ aa=8 \end{bmatrix}$ COMP_CODES= 0 1 2 4 4 5

NEXT ENTRY FOR TABLE= NONE

FIG. 6

FIG. 7A — DECOMPRESSION METHOD

FIRST ITERATION

I=0       TABLE $\begin{bmatrix} a=0 \\ b=1 \end{bmatrix}$   DCOMP_SEQ=a
J=0
FLAG=FALSE
K=0
         SUFFIX= {EMPTY_STRING}

FIG. 7B

SECOND ITERATION

TABLE $\begin{bmatrix} a=0 \\ b=1 \\ ab=2 \end{bmatrix}$   DCOMP_SEQ=ab
I=0
J=0
FLAG=FALSE
SUFFIX {EMPTY_STRING}
K=1

FIG. 7C

THIRD ITERATION

TABLE $\begin{bmatrix} a=0 \\ b=1 \\ ab=2 \\ ba=3 \end{bmatrix}$   DCOMP_SEQ=abab
I=2
J=1
FLAG=FALSE
SUFFIX= {EMPTY_STRING}
K=2

FIG. 7D

FOURTH ITERATION

I=3    TABLE $\begin{bmatrix} a=0 \\ b=1 \\ ab=2 \\ ba=3 \\ aba=4 \end{bmatrix}$   DCOMP_SEQ=ababab
J=2
FLAG=TRUE
K=4
SUFFIX=ab

FIG. 7E

FIFTH ITERATION

I=3
J=4
K=4
FLAG=FALSE
SUFFIX=(EMPTY_STRING)

TABLE:
$$\begin{bmatrix} a=0 \\ b=1 \\ ab=2 \\ ba=3 \\ aba=4 \end{bmatrix}$$

DCOMP_SEQ=abababa

FIG. 7F

SIXTH ITERATION

I=4
J=4
SUFFIX={EMPTY_STRING}
K=7
FLAG=FALSE

TABLE:
$$\begin{bmatrix} a=0 \\ b=1 \\ ab=2 \\ ba=3 \\ aba=4 \\ abaa=5 \end{bmatrix}$$

DCOMP_SEQ=abababaaba

METHOD AND APPARATUS FOR DATA COMPRESSION AND DECOMPRESSION

FIELD OF THE INVENTION

The invention relates to the compression of data and the restoring of compressed data.

BACKGROUND OF THE INVENTION

Conventional data compression systems encode a stream of digital data into a compressed code stream and decode a compressed code stream back into a corresponding original data stream. The code stream is referred as "compressed" because it is typically made up of a smaller number of codes than symbols contained in the original data stream. These smaller number of codes can then be advantageously stored in a corresponding smaller amount of memory than the original data. Moreover, the compressed code stream can be transmitted to a receiver in a wired, wireless or optical fiber system in a corresponding shorter period of time than the uncompressed original data.

Two classes of known compression techniques are special purpose and general purpose techniques. Special purpose compression techniques are designed for compressing special types of data and are often inexpensive to implement. Exemplary special purpose compression methods include run-length encoding, zero-suppression encoding, null-suppression encoding and pattern substitution. Since these compression methods compress data that typically possesses common characteristics and redundancies, they generally achieve relatively small compression ratios. A compression ratio is the measure of the length of the compressed codes relative to the length of the original data. However, special purpose compression methods tend to be ineffective at compressing data of a more general nature that does not possess the common characteristics such methods exploit.

General purpose compression techniques are not designed for specifically compressing one type of data and often adapt to different types of data during the compression process. Several data compression techniques of this type are the Huffman method, the Lempel-Ziv-78 (LZ-78) method and the Lempel-Ziv-Welch (LZW) method which are described in D.A. Huffman, "A Method for the Construction of Minimum Redundancy Codes," Proceedings IRE, Vol. 40, No. 10, pp. 1098–1100 (September 1952), J. Ziv and A. Lempei, "Compression of Individual Sequences Via Variable-Rate Coding," IEEE Trans. on Info. Theory, Vol. IT-24, No. 5, pp. 530–536 (September 1978), and U.S. Pat. No. 4,558,302, respectively, which are all incorporated by reference herein. Huffman coding maps fixed length sequences of digital data into variable length binary words. However, this compression method is inefficient when redundancies exist in sequences of the digital data which are longer than the fixed sequence lengths that the method processes at a time. Also, Huffman coding disadvantageously can not compress the symbols of data stream as they are received. The method requires that all the data symbols that are to be compressed to be available for processing.

In contrast, the LZ-78 compression technique parses a stream of input data characters into coded values based on an adaptively growing look-up table or dictionary that is produced during the compression method. A variant of the LZ-78 technique typically having lower compression ratios is the LZW technique. Both the LZ-78 and LZW techniques are based on the generation and use of a string table that maps strings of input characters into fixed-length codes. More specifically, these techniques compresses a stream of data character into a compressed stream of codes by character-serially searching the character stream and generating codes based on sequences of encountered symbols that match corresponding longest possible strings previously stored in the table. As each match is made and a code symbol is generated, the process also stores a new string entry in the dictionary that comprises the matched sequence in the data stream plus the next character symbol encountered in the data stream.

As a consequence of each new table entry, the strings maintained in the table possess the property that every string has a prefix string that is also an entry in the table. In this manner, the table entries adapt to redundancies in the data stream because the strings in the table, which are used for future matching for generation of the compressed code signals, are based on the data stream.

Although the LZ-78 and LZW techniques provide effective data compression, even smaller compression ratios are desirable to reduce storage requirements and transmission times.

SUMMARY OF THE INVENTION

The invention is based on the discovery that relatively low compression ratios can be achieved using an adaptive look-up table and successively determining sequence lengths in the data stream for encoding of a current sequence based on "looking ahead" and evaluating the encodable lengths of corresponding next sequences. More specifically, in processing a current sequence, the invention advantageously determines whether a greater number of symbols are compressed using the longest sequence that matches a string in the look-up table for a current sequence or whether by employing a shorter matching sequence, the code corresponding to the next sequence in the data stream would compress a combined greater number of symbols. This compression technique identifies those situations where it is advantageous to use a compressed code for a current sequence that corresponds to a shorter sequence than the longest matching sequence from the table for achieving an overall compression ratio reduction.

In addition, as sequences are processed for encoding, new strings are identified from the data stream for storing in the look-up table. Such entries can then be used for encoding further sequences from the data stream. The invention makes its encoding sequence length determination based on strings previously stored in the table. However, upon such a determination, the current sequence is compressed so that the encoding sequence length determination can be repeated again for the symbols in the second sequence and its subsequent sequence based on the increased number of entries in the look-up table.

This advantageous compression method is based on the realization that in using an adaptive look-up table having particular characteristics, separate parsings of the data stream can be performed for sequence length determination for data compression as well as for identifying new string entries for the look-up table. Such advantageous separate parsings facilitate the "look ahead" operation of the invention. In particular, the look-up table possesses the characteristic that each string of symbols in the table including a prefix string of symbols and an extension symbol. The prefix string of symbols corresponding to a string previously entered in the table. It is possible for the extension symbol to be a symbol that has been previously encountered in the data stream or a symbol encountered for the first time. In addition, each string in the tables has a corresponding compressed code for use in the compressed code output sequence to represent such string.

A compressed data stream generated according to the invention can be decompressed by a corresponding decompression technique of the invention which advantageously employs a "look ahead" operation for decoding. More specifically, the decompression technique successively decodes the codes in the compressed code stream and adaptively builds a look-up table based on the resulting successively extended decompressed symbol stream. Typically, in operation, this decompression method encounters compressed codes that correspond to strings previously entered in the table. However, in some instances, a compressed code is encountered for which a decompressed string has not yet been added to the table. Due to the nature of the compression technique such an encountered compressed code would correspond to the next entry to be added to the table. In order to "look ahead" and determine the decompressed symbols for this next code, the method adds the decoded symbol string added to the table during the last iteration of the method at least once to the end of the decoded sequence to determine the next table entry. The decompression technique than decodes the compressed code based on this new table entry.

The compression technique of the invention advantageously achieves low compression ratios that are typically 10% to 15% lower than those achieved by the LZW technique. The invention is particularly suitable for the data compression and decompression of information for transmission over wire, wireless or optical transmission networks or collection of networks, such as the internet, as well as for compressing data for recording information on to recorded medium such as a magnetic medium including magnetic-readable disks, as well as optical-readable medium including CD-ROM's.

Additional features and advantages of the present invention will become more readily apparent from the following detailed description and accompanying drawings.

BRIEF DESCRIPTION OF THE DRAWINGS

FIG. 5A-5H illustrates exemplary iterative pointer and compression data values obtained during operation of the method of FIG. 3 based on the uncompressed data stream of FIG. 2;

FIG. 7A-7F illustrate exemplary iterative pointer and decompression values obtained during operation of the method of FIG. 6 for the compressed code stream of FIG. 2.

DETAILED DESCRIPTION

The invention is based on the discovery that a data compression algorithm employing an adaptive look-up table can "look ahead" and determine whether an overall reduction in the compression ratio would result by compressing a current symbol sequence in a data symbol stream using a longest matching sequence or shorter matching sequence. Such a determination is made by examining the lengths of symbol sequences for the next sequence based on using different lengths for the current sequence. As used herein, data symbol stream refers to a contiguous sequence or string of symbols and can represent, for example, an ASCII text file, an executable program, a graphics file or a file containing video or audio information.

In compressing data, the invention effectively parses the data stream twice. Parsing is the partitioning of a sequence of at least one symbol from the data stream of symbols for processing. The first parsing is performed for adding strings to the look-up table. The second parsing, which can be performed substantially simultaneously or interleaved with the first parsing, performs the previously described partition identifications for the corresponding generation of the compressed code stream.

The "look ahead" feature of the invention is enabled by employing a look-up table having particular characteristics. In the look-up table, each string of symbols has the particular characteristic of containing a prefix string of symbols and an extension symbol. The prefix string of symbols corresponding to a string previously entered in the table. It is possible for the extension symbol to be a symbol that has been previously encountered in the data stream or a symbol encountered for the first time.

Figure 1:
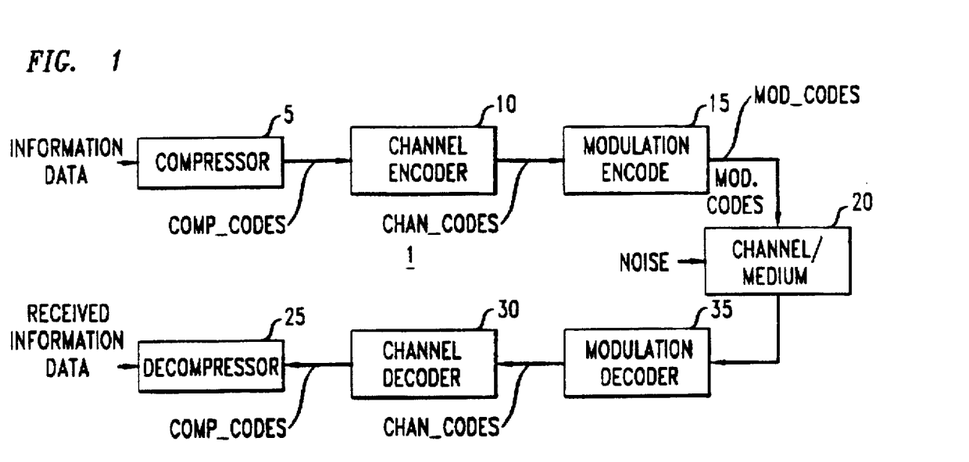
FIG. 1 illustrates a schematic block diagram of an exemplary system employing a data compressor and decompressor in accordance with the invention.

Numerous hardware and software configurations can perform the technique of the invention. The exemplary configuration described below with regard to the figures is for illustration purposes only and is not meant to be a limitation of the invention. FIG. 1 depicts an exemplary system 1 employing a data compressor 5 and decompressor 35 in accordance with the invention. The system 1 is useful for transmitting and receiving information a transmission medium, such as a wire, air or an optical fiber. In such configurations, it is possible for the data symbols and corresponding compressed codes to be represented by electrical, magnetic or optical signals.

The system 1 is alternatively useful for recording information to, and reading information from, for example, a magnetic medium such as computer disk drives or optical-readable medium such as CD-ROM's. It is possible to record data compressed according to the invention on to recordable medium including magnetic medium, such as magnetic disk drives, and optical recordable medium, such as CD-ROM's and holographic memories. As a consequence, it is possible for the data compression and/or decompression methods to be performed in an associated memory controllers, such as, for example, a disk drive controller and a data reading section of a CD-ROM drive.

In FIG. 1, information DATA such as, for example, ASCII formatted data or graphical or video digital data, in the form of a data stream of symbols is compressed by the compressor 5 according to the invention to produce compressed code stream information COMP_CODES. The information DATA is compressed to reduce the mount of data to be recorded or transmitted. The compressed information COMP_CODES is then encoded by the channel encoder 10 to produce the channel encoded information CHAN_CODES. Channel encoding adds information to the compressed information to enable error detection and/or correction in the reading process. Conventional channel encoding techniques include Reed-Solomon encoding which is described in S. Lin and D. J. Costello, Error Control Coding, Prentice-Hall, Englewood Cliffs, N.J. (1983), which is incorporated by reference herein. The Reed-Solomon encoded information includes a sequence of symbols wherein each symbol is represented by one or more data bits. These symbols are then modulation encoded by the encoder 15 which produces an N-symbol codeword MOD_CODES defining a channel sequence that is transmitted through transmission channel or recorded on medium 20.

Noise and interference are often introduced in the transmission channel or medium 20. A modulation decoder 25 and channel decoder 30 receive the modulation encoded information with noise and reverse the encoding processes of the channel and modulation encodes 10 and 15, respectively. The decoded information produced by the channel decoder 30 corresponds to the compressed information COMP_CODES generated by the compressor 5. The decoded information COMP_CODES is then decompressed according to a technique of this invention as described in detail below with regard to FIGS. 6 and 7A through 7F, to produce the original information DATA that was received by the compressor 5.

The function blocks of the system 1, such as the compressor block 5, denote the processes performed by the block and such processes can be performed by either shared or dedicated hardware, including, but not limited to, hardware capable of executing software instruction code. For example, it is possible to implement the compression and decompression techniques of the invention in circuitry such as, for example, by application specific integrated circuits (ASIC's), digital signal processors (DSP's) and programmable logic arrays, or by computing devices such as, for example, microprocessors, microcontrollers, computers or other computing devices executing software instruction code residing in associated memories. The configuration of the system 1 is for illustration purposes only and is not meant to be a limitation of the invention. It is possible to use the data compression and decompression techniques of the invention without either or both of the channel and modulation encoding or with other encoding techniques.

Figure 2:
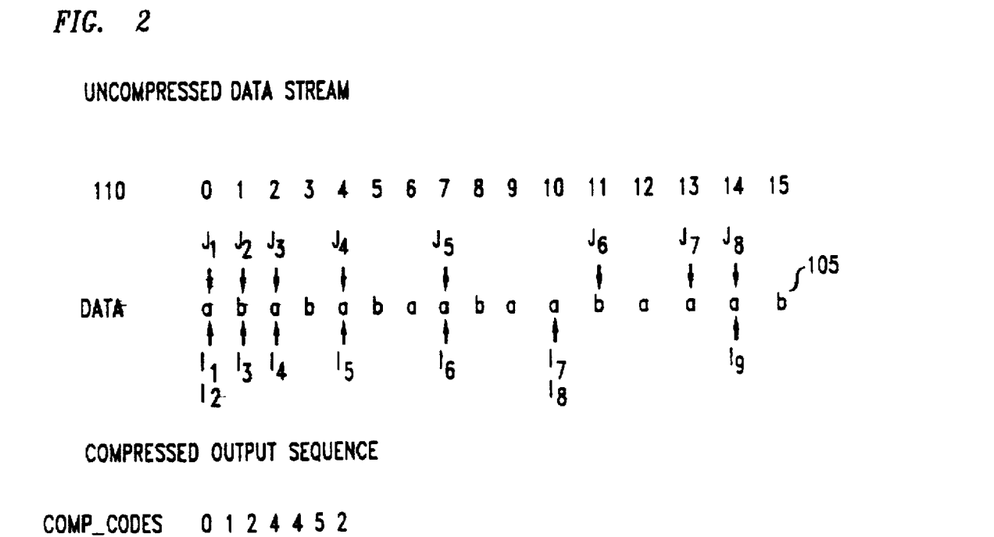
FIG. 2 is an illustration of exemplary uncompressed data stream and a corresponding compressed code stream encoded in accordance with the invention by the data compressor in FIG. 1.

Symbols 105 of an exemplary data stream DATA of FIG. 1 are shown in FIG. 2. It is possible for symbols 105 in the data stream DATA to be digital signals representing alphanumeric characters, such as ASCII formatted text. ASCII formatted information typically represents 256 symbols or characters using 8 digital information bits. In the alternative, it is possible for the symbols 105 to represent non-alphanumeric information, such as image or audio data or other types of data. Moreover, such symbols need not be in digital format and can be analog signals representing, for example, speech, graphic or video information.

In the depicted data stream DATA, the symbols 105 are arranged from left to right on the page in the order they are received by the compressor 5 of FIG. 1 or in the order they are to be processed. Positions of the symbols 105 in the stream DATA are indicated by position numbers 110 for ease of discussion. Throughout this description, particular sequences of symbols in the data stream DATA will be represented as DATA [x:y] where the values of x and y denote the starting and ending position of the sequence. For instance, DATA[0:2] indicate a sequence in the data stream DATA from the position 0 to the position 2 which is the sequence "aba". For convenience, the representation DATA [x:x] or DATA[x] denote a single symbol in the data stream DATA at the position x.

The depicted 16 symbols in the data stream DATA can be compressed in accordance with the invention into an exemplary seven bits as shown in the compressed code stream COMP_CODES in FIG. 2. This compressed code stream COMP_CODES is 12.5% smaller than the eight symbols that would be generated by the previously described conventional LZW compression technique. Such a compression improvement is substantial in compressing large amounts of information, such as, for example, information on the order of kilobits or megabits.

Figure 3:
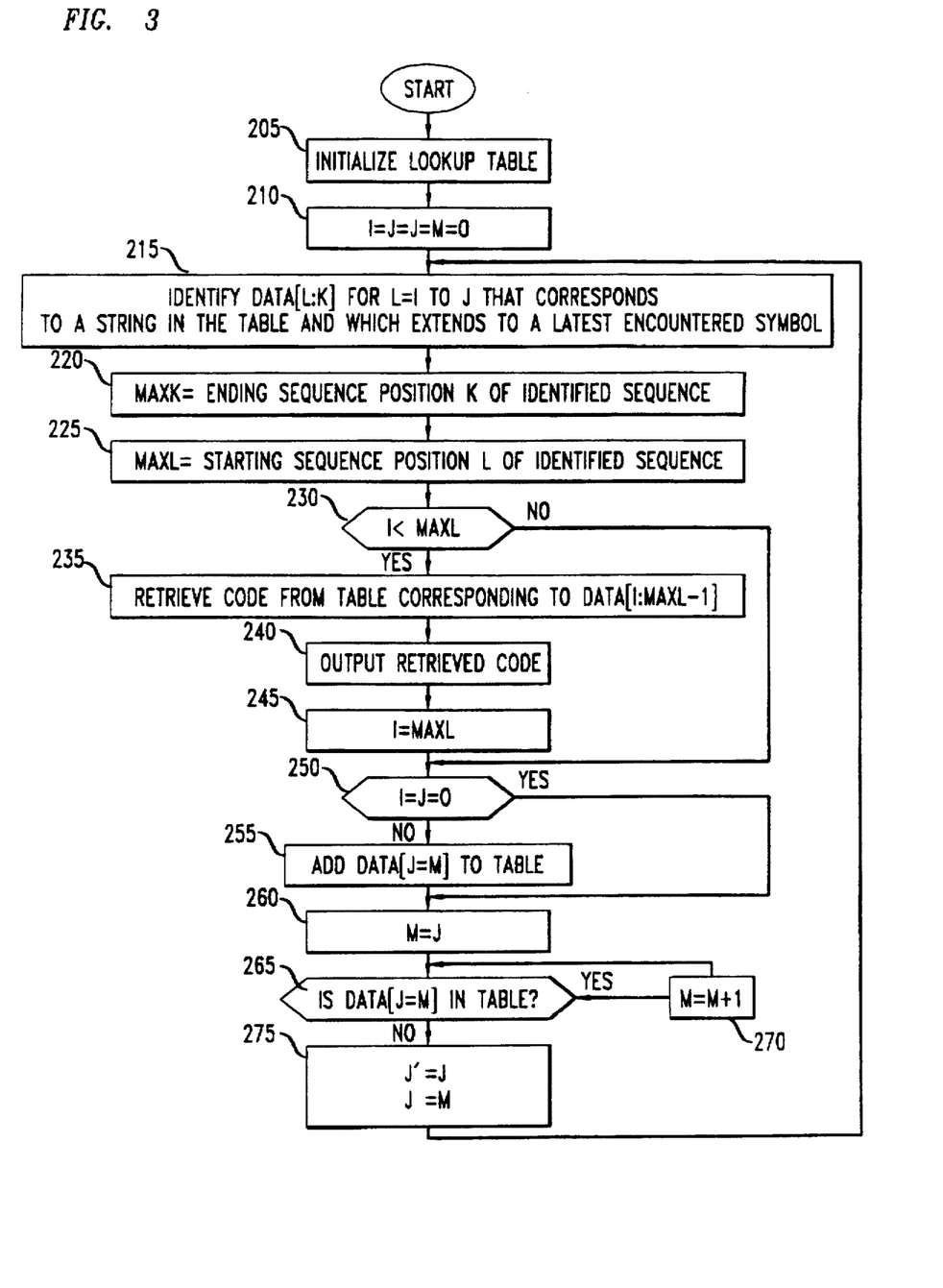
FIG. 3 illustrates a flow diagram of an exemplary data compression technique in accordance with the invention that is useable by the data compressor in FIG. 1.

An exemplary compression method 200 of the invention, is shown in FIG. 3 and is useable by the compressor 5 of FIG. 1 to compress a data stream, such as the exemplary data stream DATA, into a corresponding compressed stream. In FIG. 3, a look-up table and pointers I, J, J', and Mare first initialized in steps 205 and 210, respectively. The lookup table can be maintained in a memory device associated with the compressor 5. The pointers I, J, J', and M' are employed to point to symbol positions in the data stream DATA during the operation of the compression method. It is possible for the table initialization step 205 to establish the table with a plurality of initial entries including, for example, a known set of symbols from which the data stream DATA was generated. For example, the set of possible symbols used for generating the data stream DATA is a and b. Such a two-symbol set is used for ease of illustration purposes only and it should be readily understood that data streams generated for symbol sets containing numbers of symbols can be compressed in accordance with the invention in the same manner. In operation, the compression method 200, adds new strings to this table.

After the lookup table and the pointers are initialized in steps 205 and 210, the method 200 parses the data stream in step 215 to identify a sequence DATA[L:K] in the data stream that is contained in the table 300 and that extends to a latest encountered symbol for sequences starting from the symbol for positions between the pointers I and J. The symbol position L and K correspond to the starting and ending sequence positions of the identified sequence, respectively. In effect, step 215 compares the encoding of a longest possible present sequence starting at the position I in the data stream with the encoding of longest possible next sequences starting at positions from I+1 to J based on strings previously stored in the table. Such comparison enables the determination of the partitioning arrangement that would advantageously encode the relatively largest number of symbols using a relatively small number of coding symbols. The step 215 is described in greater detail below with regard to the compression of the data stream DATA of FIG. 2.

After the particular sequence DATA [L:K] is identified in step 215, the value MAXK and MAXL are assigned, in steps 220 and 225, the values of the positions K and L, which are the last and first encountered symbols in that sequence, respectively. Then, in step 230, if the pointer I is pointing to an earlier encountered symbol position in the data stream DATA, i.e., a lower position value, than the value MAXL, the method 200 proceeds to step 235, otherwise it proceeds ahead to step 250. In step 235, the identifier code representing the string in the table that corresponds to the sequence DATA[I:MAXL-1] is retrieved and in step 240, the retrieved code is added to the compressed output sequence COMP_ CODES.

The evaluation in step 230 determines if the identified sequence DATA [L:K] or DATA[MAL:K] corresponds to a current sequence, i.e., a sequence starting at the position I in the data stream DATA or a next sequence starting at a symbol position encountered after the position L. If the identified sequence DATA [L:K] is a next sequence, then in step 235 and 240, the code for the corresponding current sequence of DATA[I:MAXL-1] is retrieved and added to the compressed output sequence COMP_CODES. The pointer I is then updated in step 245 to point to the position of MAXL which is the symbol immediately after the last symbol of the sequence encoded in steps 235 and 240.

Next, in step 250, if the pointers I and J are not equal to 0, the method 200 proceeds to step 255, otherwise the method 200 proceeds ahead to step 260. In step 255, the sequence in the data stream DATA between the pointers J' and M is added as an entry in the look-up table. Such a lookup table addition is described in greater detail below with regard to FIGS. 5A–5K. Then, in step 260, the pointer M is set to the position of the pointer J. Steps 265 and 270 then determine the shortest sequence in the data stream DATA[J:M] starting at position J that is not in the look-up table. It should be readily understood that since a set of symbols used to generate the dam stream is contained in the table, the shortest sequence encountered in the data stream includes a prefix string of at least one symbol corresponding to a string previously entered in the table and an extension symbol. The pointers J' and J are then updated to the positions of the pointers J and M, respectively, in step 275, and the method 200 returns to step 215 to identify and process the next sequence in the data stream.

The steps of the method 200 are successively performed for the length of the data stream to generate the compressed output code stream. This successive performance of steps 125 to 245 produces a first parsing for encoding the data stream while the successive performance of steps 250 to 275 produces a second parsing simultaneously or interleaved with the first parsing that adaptively adds entries to the lookup table based on the symbols encountered in the data stream. During such second parsing, steps 250 and 255 delay the entry of strings to the look-up table such that the strings identified for entry into the table in an iteration of the method 200 are not added to the table until the next iteration of the method 200. The reason for such a process will become apparent from the following example.

Figure 4:
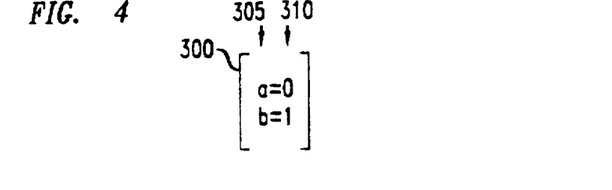
FIG. 4 is an exemplary initialized lookup table for use with the compression method of FIG. 3.

The successive performance of the method 200 will be described with respect to compressing the data stream DATA of FIG. 2 into the seven compressed output codes in the stream COMP_CODES, also shown in FIG. 2. The respective pointer values, table entries and compressed output codes generated during the successive performance of the method 200 are shown in FIGS. 5A through 5K. First, the look-up table is initialized in step 205. An exemplary initialized table 300 for the data stream DATA of FIG. 2 is shown in FIG. 4. The lookup table 300 possesses the table entries 305 of a and b and corresponding identifier codes 310 that are to be used for generating the compressed code stream COMP_CODES. Although the identifier codes 310 are shown in the table 300, it is possible that such codes be determined using the table addresses of the corresponding string entries or by other processing techniques.

Next, in step 210, the pointers I, J, J' and M are set to the symbol location 0 which is the symbol a in FIG. 2. The pointers I and J are shown in FIG. 2 with the subscript suffix "$_1$" to denote the pointer location at the first iteration of the method 200. The pointer J' has not been shown because it corresponds to the immediate previous value of the pointer J after the first iteration of the method 220. The data stream sequence DATA[L:K] is the identified, in step 215, that extends to a latest encountered or furthest symbol for L=I to J, which is L=0 to 0=0. In other words, starting from the symbol a at position 0, what is the longest sequence in the data stream DATA that matches a string in the table 300. Since the only siring in the table starting with a is entry "0"

or a, the sequence DATA[L:K] is DATA[0:0] in step 215 and the values MAXK and MAXL are both set to zero in steps 220 and 225. Then, in step 230, since the value of pointer I is not less than the value of MAXL, the method 200 proceeds to step 250.

Figure 5A:
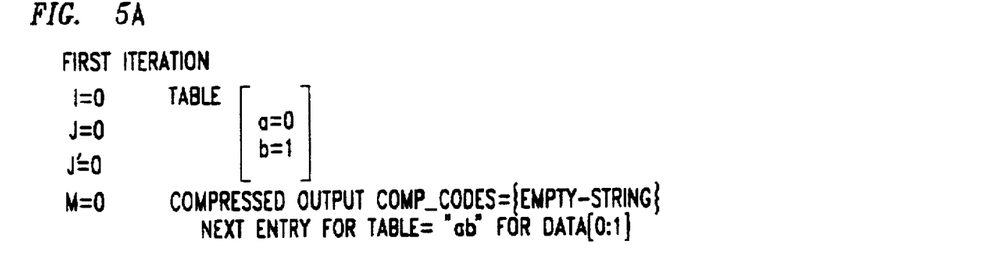

In step 250, since the pointers I and J are equal to the position 0, the method 200 proceeds to step 260 where the pointer M is set to the position of the pointer J which is 0. Then, steps 260 and 265 determine the shortest sequence in the data stream DATA that is not in the table 300 starting at the position DATA[J:M]. In the first iteration of the step 255 and 260 loop, the sequence DATA[0:0] is the symbol a at position 0 which is entry "0" in the table 300. In the next iteration of the loop, the method 200 determines that the sequence DATA [0:1] of "ab" is not in the table 300. This identified string "ab" will not be added to the table until the next execution of the steps 250 and 255 in the next iteration of the method 200. The pointers J' and J are then updated to the positions of J and M, respectively, which are 0 and 1. Accordingly, at the end of the first iteration of the method 200, no compressed output codes were generated as is shown in FIG. 5A and although a string has been identified for an entry to the table, no new entries were actually added to the table 300, as is also shown in FIG. 5A.

In the next iteration, at step 215, the pointers J' and J are set to positions 0 and 1, respectively, and the pointer I is still set to position 0. The pointer J for this iteration is shown in FIG. 2 with a subscript suffix "$_2$" to denote the position of the pointer J at the second iteration. In step 215, the sequence DATA[L:K] that extends to a latest encountered or furthest symbol is determined for L=0 and 1. For L=0, the longest string in the table is the first entry a for DATA[0:0], and for L=1, the longest matching string in the table is the second entry b for DATA[1:1]. Since the sequence DATA [1:1] extends to a later encountered symbol, namely the symbol position 1, as compared with the sequence of DATA [0:0] ending at position 0, the sequence DATA[1:1] is identified in step 215 and the values MAXK and MAXL are set to 1 and 0 in steps 220 and 225, respectively. In step 230, the pointer I is equal to 0, which is less than the value of MAX/; of 1, so the method proceeds to step 235.

Figure 5B:
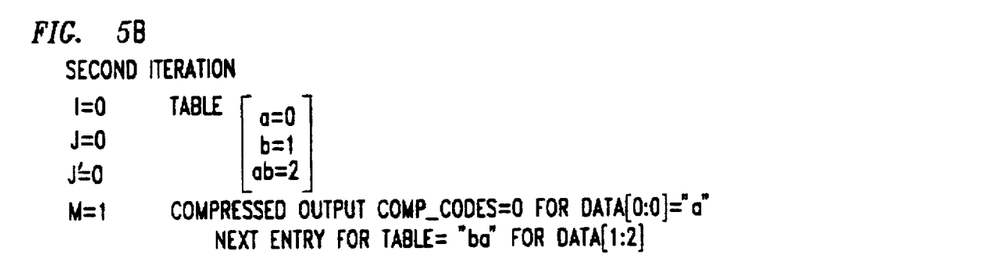

The method 200 retrieves the code from the table 300 corresponding to the entry equal to DATA[I:MAXL-1], in step 235, which is DATA[0:(1-1)] or DATA[0:0] =a or entry "0" in the look-up table. Thus, in step 240, the code "0" is generated as part of the compressed code stream COMP_ CODES as shown in FIG. 5B. Then, in step 245, the pointer I is set to the value of MAXL of 1. Since, the values of the pointers I and J are both equal to 1 and not 0 in step 250, the method 200 proceeds to step 255 where the sequence DATA[J':M] or DATA[0:1]="ab" is added to the table 300 as entry "2" as shown in FIG. 5B. The pointer M is then updated to the value of the pointer J of 1 in step 260 and then steps 265 and 270 determine the shortest encountered sequence in the data stream DATA that is not in the table 300 starting at the location 1 which is DATA[J:M] or DATA[1:2]="ba". The pointers J' and J are then updated to the positions of J and M which are 1 and 2, respectively. Accordingly, at the end of the second iteration, the entry "2" has been added to the table 300 and the compressed output code COMP_CODES symbol of "0" was generated as is shown in FIG. 5B.

Figure 5C:
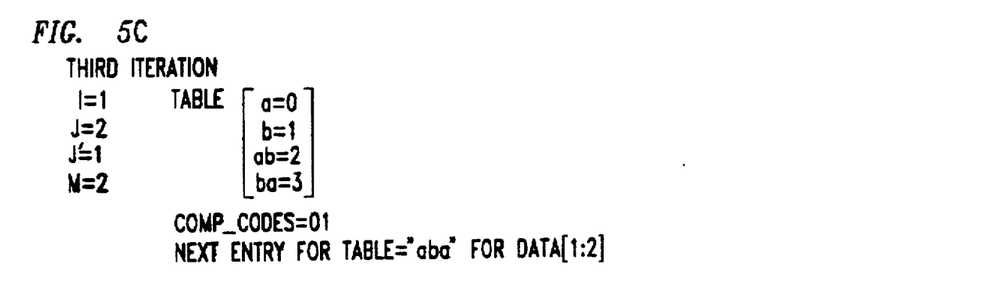

The third iteration of the method 200 is performed in the same manner with the pointers I=1, J=2, J'=1 and M=2, the pointers I and J for the third iteration are denoted with a subscript suffix "$_3$" in FIG. 2. In this iteration, step 215 evaluates the sequence DATA[J:K] for L=1 and 2. This iteration then yields a compressed output code "1" corresponding to the encoding of the symbol "b" at the data stream position 1. This compressed code is added to the compressed code sequence COMP_CODES as shown in FIG. 5C. The string DATA[1:2]="ba" identified in the second iteration is added to the table 300 as entry "3" and a sequence DATA[2:4]="aba" is identified for entry into the table 300 during the next iteration of the method 200 as shown in FIG. 5C.

Figure 5D:
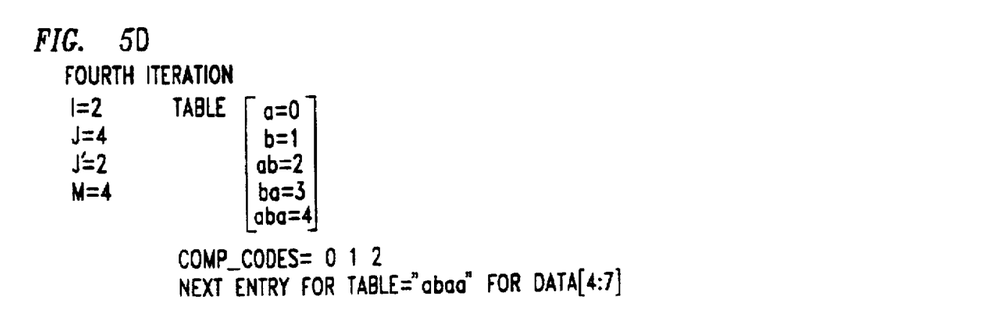

The fourth iteration of the method 200 is performed in the same manner as the second and third iterations with the pointers I=2, J=4, J'=2 and M=4. The pointers I and J for the fourth iteration are denoted with a subscript suffix "$_4$" in FIG. 2. The fourth iteration yields a compressed output symbol of a "2" corresponding to the encoding of the symbol "ab" for the data stream sequence DATA[2:3]. Again, this compressed code is added to the compressed code sequence COMP_CODES as shown in FIG. 5D. The string DATA [2:4]="aba" identified in the third iteration is added to the table 300 as entry "4" and a sequence DATA[4:7]-"abaa" is identified for entry into the table 300 dating the next iteration as shown in FIG. 5D.

Figure 5E:
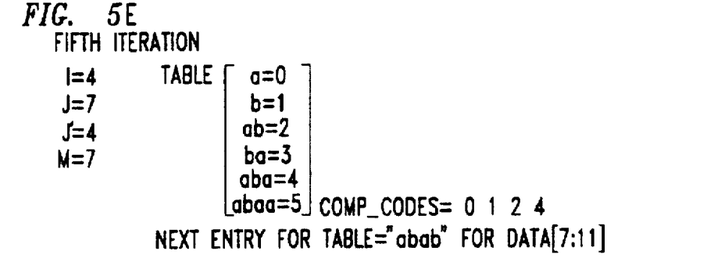

The fifth iteration of the method 200 is performed in the same manner as the fourth iteration with the pointers 1-4, J=7, J'=4 and M=7. The pointers I and J for the fifth iteration are denoted with a subscript suffix "$_5$" in FIG. 2. The fifth iteration yields a compressed output code of a "4" corresponding to the encoding of the symbol "aba" for the data stream sequence DATA[4:6]. This compressed code is added to the compressed code sequence COMP_CODES as shown in FIG. 5E. The string DATA[4:7]="abaa" identified in the fourth iteration is added to the table 300 as entry "5" and a sequence DATA[7:11]="abaab" is identified for entry into the table 300 during the next iteration as is also shown in FIG. 5E.

Figure 5F:
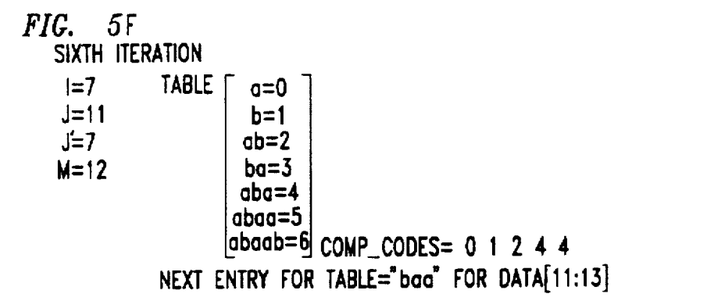

The sixth iteration of the method 200 is performed in the same manner as the fifth iteration with the pointers I=7, J=11, J'=7 and M=11. The pointers I and J for the sixth iteration are denoted with a subscript suffix "$_6$" in FIG. 2. The sixth iteration yields a compressed output code of another "4" corresponding to the encoding of the symbol "aba" for the data stream sequence DATA[7:9] which is added to the compressed code sequence COMP_CODES as shown in FIG. 5F. The suing DATA[7:11]="abaab" identified in the fifth iteration is added to the table 300 as entry "6" and a sequence DATA[11:13]="ban" is identified for entry into the table 300 during the next iteration as is also shown in FIG. 5F.

In the seventh iteration, the pointer values are as follows: I=10, J=13, J'=11 and M=13. The pointers I and J for the seventh iteration are denoted with a subscript suffix "$_7$" in FIG. 2. In step 215 during the seventh iteration, the sequence DATA[L:K] that extends to a latest encountered or furthest symbol is determined for L=I to J, which is L=10, 11, 12 and 13. For L=10, the longest sequence corresponding to a string in the table 300 is DATA[10:13] of "abaa", for L=11, the longest sequence corresponding to a string in the table 300 is DATA[11:12] of "ba", for L=12, the longest sequence corresponding to a string in the table 300 is DATA[12:12] of "a", and for L=13, the longest sequence corresponding to a string in the table 300 is DATA [13:14] of "ba". Thus, the corresponding sequences starting at position L=10 and 13 both extend to the location 13. In accordance with the invention, the suing being at the earliest encountered location, i.e., the position 10 in this example, should be used for the method 200. Thus, MAXK and MAXL are set to 13 and 10, respectively in steps 220 and 225.

Figure 5G:
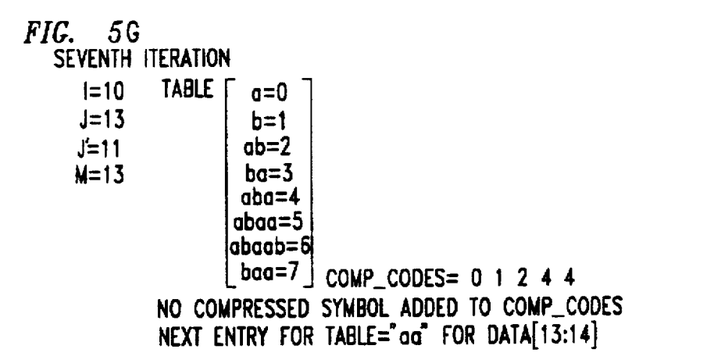

Then, in step 230, since I and MAXL are equal, the method bypasses generating a corresponding compressed output code in steps 235 and 240, and proceeds directly to the table building steps 250–265. During these steps, the string DATA[11:13]="ban" identified in the sixth iteration is added to the table 300 as entry "7" and a sequence DATA [13:14]="an" is identified for entry into the table 300 during the eighth iteration as is shown in FIG. 5G.

Figure 5H:
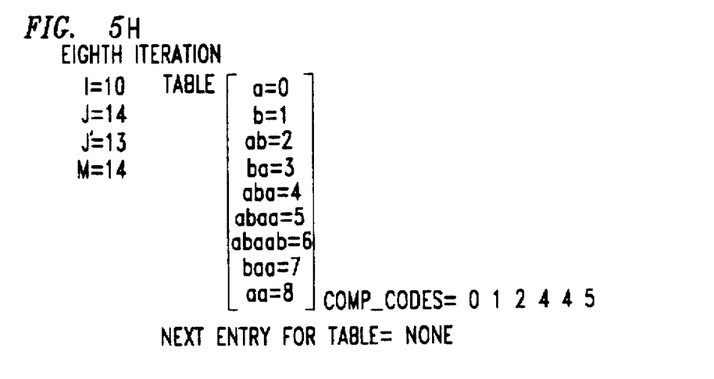

During the eighth iteration, the pointers are set to the values I=10, J=14, J'=13 and M=14. The pointers I and J for the eighth iteration are denoted with a subscript suffix "$_8$" in FIG. 2. In step 215 during this iteration, the sequence DATA[L:K] that extends to a latest encountered or furthest symbol is determined for L=I to J, which is L=10, 11, 12, 13 and 14. The corresponding longest sequences for L=10 through 13 are recited for the previous iteration and is the position 14 for L=13. The longest sequence starting at L=14 is "ab" ending at position 15. Accordingly, the string corresponding to a suing in the table 300 that extends to a latest encountered symbol is DATA[14:15] for "ab". Thus, the values MAXK and MAXL are set to 15 and 14, respectively in steps 220 and 225. Thus, in step 230, since I=10 is less than the value MAXL=14, the method generates a corresponding matching compressed output code of "5" for the data stream sequence DATA [10:13]="abaa" as is shown in FIG. 5H. As a consequence, it can be seen that the compression method of the invention generates compressed output codes, not based on the longest possible encountered sequence that corresponds to a string in the table 300, but by "looking ahead" and determining if a lower compression ratio can be achieved by encoding a shorter sequence by examining the corresponding lengths of possible next sequences in the data stream DATA.

The eighth iteration then performs the table building steps 250 to 265 in the same way as previously described for the earlier iterations. Further, the ninth, tenth and eleventh iterations are performed in the same manner to achieve the compressed output codes COMP_CODES shown in FIG. 2. The resulting compressed output stream COMP_CODES advantageously contains a relatively short 7 symbols, in contrast to the original 16 bits of the data stream DATA.

The parsing of the data stream separately for building the table and for generating the compressed output stream enables the method of the present invention to "look ahead" and determine which sequence length is appropriate for a current sequence based on the length of the next sequence that can be encoded.

Although the method 200 of FIG. 3 identifies a sequence that extends to a relatively latest encountered symbol in step 215, in an alternative embodiment of the invention it is possible for the method 200 to identify a sequence that extends to a later encountered symbol relative to at least one of the other sequences evaluated in step 215. Such an identified sequence may not necessarily be the relatively latest encountered symbol. In such a manner, the invention achieves an advantageously lower compression ratio than could be achieved by the previously described LZ and LZW techniques but not quite as low as that achievable by the method 200 in FIG. 3.

A decompression technique in accordance with the present invention employs a similar "look ahead" operation to iteratively decode a compressed code stream generated by the data compression method of the invention. The decompression technique sequentially decodes the codes in the compressed code stream and adaptively builds a look-up table based on the corresponding generated intermediate symbols in the produced decompressed sequence. Typically, in decoding a compressed code stream, the method encounters compressed codes that correspond to previously stored entries in the table.

However, in some instances, a code is encountered that has not previously been added to the table. Nevertheless, due to the nature of the a compressed code stream in accordance with the invention, the missing string entry corresponding to this code is the next string entry that is to be added to the table. In these instances, the decompression method "looks ahead" to determine the next string for table entry. In accordance with the invention this "look ahead" determination is accomplished by adding the particular decoded sequence that was identified in a last iteration of the method, at least once, to the end of the present decoded symbol sequence in order to determine this next table entry. The previously described characteristics of the look-up table entries enables such a "look ahead" determination.

Figure 6:
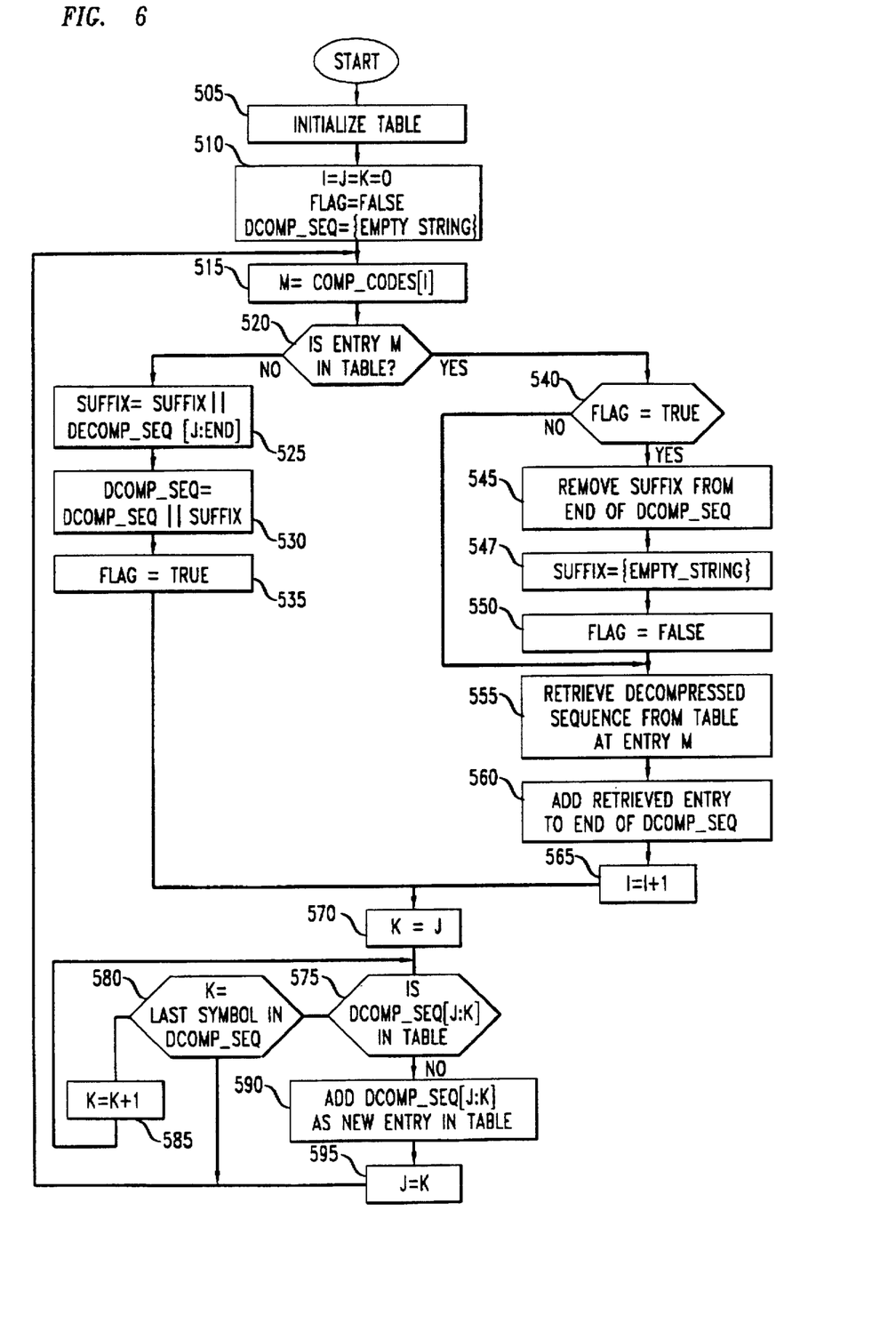
FIG. 6 illustrates a flow diagram of an exemplary data decompression technique in accordance with the invention that is useable by the decompressor in FIG. 1.

An exemplary decompression method 500 according to the invention for decoding compressed codes produced by the method 200 of FIG. 3 is shown in FIG. 6. In the method 500, steps 515 to 565 of the method 500 concern the iterative decompression of the compressed codes in the compressed code sequence COMP_CODES, while steps 570 to 595 are directed to the building of the look-up table. The table building steps 570 to 595 are similar to those steps 265 and 270 of the data compression method 200 of FIG. 3. The look-up tables produced by the respective data compression and decompression methods of the invention are identical for the corresponding encoding and decoding of a particular uncompressed sequence.

The decompression steps 515 to 565 sequentially process the codes in the compressed code sequence COMP_CODES and if the entry exists in the look-up table for a given code, the method 500 retrieves the decompressed symbol and concatenates it to the corresponding decompressed output sequence DCOMP_SEQ. However, in some instances, there will be no corresponding entry in the table. In such instances, this vacant entry is always the next entry to be added to the table due to the characteristics of the compression technique. The method 500 "looks-ahead" to determine this next string entry by temporarily concatenating the last string added to the decompressed sequence DCOMP_SEQ. Steps 575 to 585 then determine the table entry based on this extended sequence DCOMP_SEQ. Then, in the next iteration of the steps 515 to 565, the temporarily added string is removed in step 545 and the proper table entry is now present such that in steps 555 and 560, it can now be retrieved and added to the decompressed sequence DCOMP_SEQ.

More specifically, the method 500 first initializes a look-up table, such as the initialized table 300 in FIG. 4 produced by the initialization step 205 of the compression method 200. The look-up table can be initialized with entries corresponding to the set of symbols used to construct of the original symbol stream from which the compressed code stream was formed. Next, pointers, flags and strings are initialized in step 510. In particular, pointers I, J and K are set to the position 0, a flag FLAG is set to "false", and a string SUFFIX and decompressed output stream DCOMP_SEQ are set to empty strings. Then, in step 515, a value M is then set to the code in the compressed code sequence COMP_CODES at position I.

Then, in step 520, if an entry is not present in the look-up table for the code M, the method 500 proceeds to step 525. In step 525, the string SUFFIX is concatenated with the symbol sequence DCOMP_SEQ[J:END] to form a new string SUFFIX. The position END refers to the last symbol of the generated sequence DCOMP_SEQ. Then, in steps 530 and 535, the new string SUFFIX is concatenated to the end of the decompressed sequence DCOMP_SEQ and the flag FLAG is set to "true" before the method 500 proceeds to step 570.

However, if in step 520, the method 500 determines that an entry in the look-up table exists for the value M, the method 500 proceeds to step 540. In step 540, if the flag FLAG is set to "true", then the method 500 proceeds to step 545, otherwise it proceeds ahead to step 555. In step 545, the sequence of symbols previously added at the end of the decompressed sequence DCOMP_SEQ that corresponds to the string SUFFIX is deleted. Then, the string SUFFIX is reset to an (empty string) in step 547, and the flag FLAG is reset to "false" in step 550.

Next, in step 555, a decompressed string from the table is retrieved from the table location corresponding to the value at the encountered symbol position I of the compressed code sequence COMP_CODES. The retrieved string is then added to the decompressed output sequence DCOMP_SEQ in step 560. The pointer I is then incremented in step 565 before the method 500 proceeds to step 570.

In step 570, the pointer K is set to the value of the pointer J. Then, in step 575 to 585, the shortest sequence in the decompressed output sequence DCOMP_SEQ starting at position J that is not in the look-up table is determined. Such a determination can be substantially identical to that previously described with respect to steps 265 and 270 of FIG. 2. It should be readily understood that since a set of possible symbols encountered in the decompressed output sequence is contained in the look-up table, the shortest sequence encountered in the sequence includes a prefix string of at least one symbol corresponding to a string previously entered in the table and an extension symbol.

Then, in step 590, the string identified in step 575 is added as a new entry in the look-up table. The pointer J is then set to the value of the pointer K in step 595 and the method 500 proceeds to step 515 to process the next value in the compressed string COMP_CODES. However, during the determination by steps 575 to 585 in identifying the shortest sequence in the decompressed sequence that is not in the look-up table, if in step 580, the method 500 determines that the pointer K is at the last symbol in the sequence DCOMP_SEQ, then the method proceeds back to step 515 without the addition of a table entry in step 590. In such an instance, a shortest sequence has not been identified because the sequence between the pointer J and the end of the sequence DCOMP_SEQ corresponds to an entry contained in the table.

The operation of the decompression method 500 will now be described with respect to the decoding of the particular compressed code sequence COMP_CODES of FIG. 2. The corresponding pointer values and sequences during the operation of the method 500 are shown in FIGS. 7A–7F. First, the look-up table is initialized with the set of symbols that were used to produce the original uncompressed data stream in step 505. Such an initialized table is shown in FIG. 4 with the symbols "a" and "b" at corresponding entries "0" and "1", respectively. The pointers, J, and K are then set to the location 0 and the strings SUFFIX and DCOMP_SEQ are set to empty strings in step 510. The pointers J and K correspond to positions in the decompressed output sequence DCOMP_SEQ and the pointer I corresponds to positions in the compressed code sequence COMP_CODES.

Figure 7A:
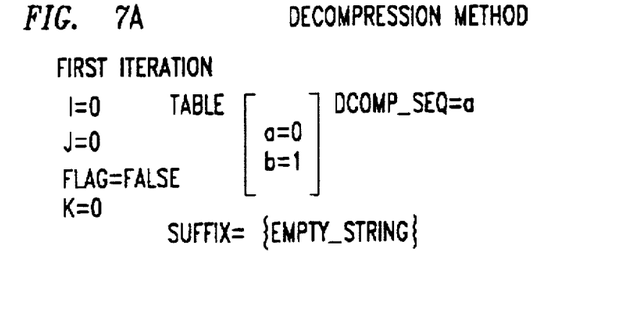

Then, in step 515, the value M is set to the code in the position I, i.e., position 0, of the compressed code sequence COMP_CODES which is a "0". Since an entry exits in the table corresponding to the code "0", i.e., the symbol "a", and since the flag FLAG is "false", the method 500 proceeds to step 555. In step 555, the decompressed sequence entry in the table corresponding to the code M is retrieved and, in step 560, the retrieved sequence is added to the decompressed sequence DCOMP_SEQ as is shown in FIG. 7A. The pointer I is then incremented in step 565. Next, in steps 570 to 580, the sequence in the decompressed sequence DCOMP_SEQ starting from the pointer J to the end, which is the symbol "a" is an entry in the look-up table. Thus, the method 500 proceeds back to step 515 for the next iteration without adding a sequence to the look-up table.

Figure 7B:
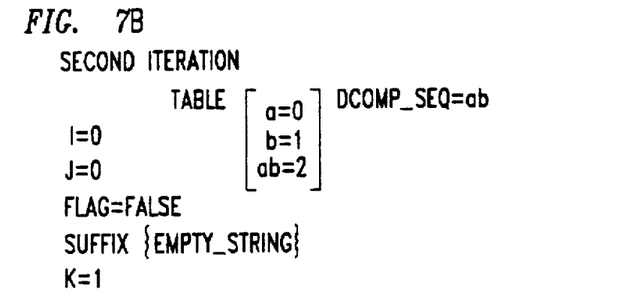
Figure 7C:
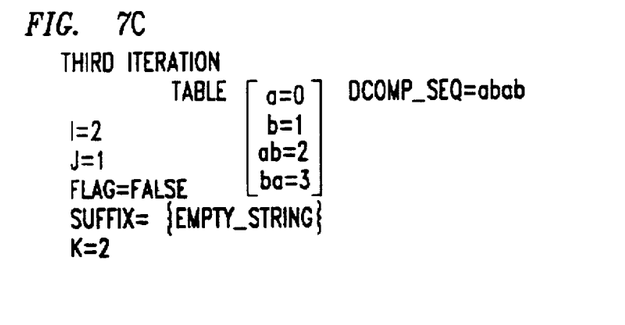

The second iteration is performed in substantially the same manner as the first iteration. In step 515, since the pointer I is the position 1 in the compressed code sequence COMP_CODES of FIG. 2, the value M is the code "1". Since an entry exists in the look-up table corresponding to the code "1", namely the symbol "b", and since the flag FLAG is still "false", the method 500 proceeds to steps 555 and 560 where the decompressed entry "b" in the look-up table is retrieved and concatenated to the decompressed sequence DCOMP_SEQ as is shown in FIG. 7B. Then, in steps 570 to 590, the shortest sequence in the decompressed sequence DCOMP_SEQ[J:K] that is not an entry in the look-up table starting at the position J, i.e., position 0, is identified and added as an new entry in the look-up table. The identified shortest sequence is DCOMP_SEQ[1:2] which is "ab" which is added to the table as entry "2" as is also shown in FIG. 7B. The pointer J is then set to the value of the pointer K in step 595. The third iteration is performed in substantially the same manner as the first and second iterations. The pointers I and J for the third iteration are the sequence positions 2 and 1, receptively. The code at the position/of the compressed code sequence COMP_CODES is a "2". An entry exists in the table corresponding to the code of "2", namely "ab", which is concatenated at the end of the decompressed sequence DCOMP_SEQ as is shown in FIG. 7C. Further, a new table entry is identified from the decompressed string DCOMP_SEQ from the pointer J=1, which is "ba", and entered in the table as entry "3" as is also shown in FIG. 7C. The pointer J is then set to the decompressed sequence location of the pointer K=2 in step 595.

Figure 7D:
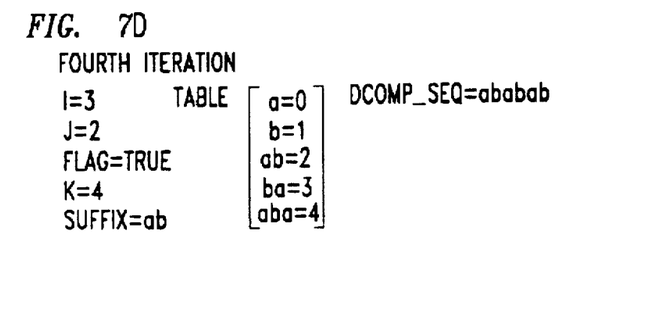

In the fourth iteration, the value M is assigned the code at position I=3 in the sequence COMP_CODES which is code "4". No corresponding entry exists in the lookup table for a code "4". The last entered string in the table corresponded to a code "3". Accordingly, the method 500 proceeds to step 525 where the string SUFFIX is set to DCOMP_SEQ [J:END] with J=2 based on the present decompressed sequence shown in FIG. 7C. The end of the sequence DCOMP_SEQ is at position 3, so the string SUFFIX= SUFFIX||DCOMP_SEQ[J:END]={empty_string}||DCOMP_SEQ[2:3]="ab". The string Suffix is then concatenated to the end of the sequence DCOMP_SEQ in step 530 to yield an expanded sequence DCOMP_SEQ||SUFFIX="abab"||"ab"="ababab" as shown in FIG. 7D. The flag FLAG is then set to "true" in step 535 and the method 500 proceeds to steps 570 to 595 to identify and add the next entry to the look-up table based on the expanded decompressed sequence DCOMP_SEQ. Accordingly, the shortest sequence on the decompressed sequence DCOMP_SEQ start from the location J of 2 is DCOMP_SEQ[2:4]= "aba" which is then added to the table at an entry location corresponding to a code of "4" as is shown in FIG. 7D.

In the fifth iteration the pointer J is a 4 and the pointer I remains at location 3. As a consequence, the value M in step 515 is set to the same code "4", i.e., DCOMP_SEQ[3], as it was assigned during the fourth iteration. However, in this iteration, a table entry now exists for the code "4", so the method 500 proceeds from step 520 to step 540. Next, since the flag FLAG is set to "true" the method 500 further proceeds to step 545. In step 545, the sequence DCOMP_SEQ is amended to remove the symbols at the end of the sequence that were added by the concatenation of the string SUFFIX dating step 530 of the previous iteration. These temporarily added symbols were added to the sequence DCOMP_SEQ to perform the "look ahead" for identifying the next table entry and are not required for these decompression steps. After the sequence DCOMP_SEQ is amended in step 545, the flag FLAG is reset to "false" in step 550.

Figure 7E:
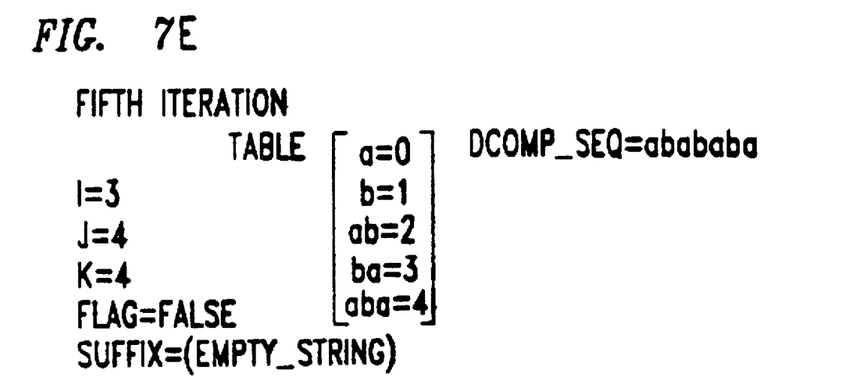

Then, the new entry in the look-up table, i.e., the sequence "aba", which corresponds to the code "4" is retrieved and added to the decompressed sequence DCOMP_SEQ in the same manner as described for the previous iterations as shown in FIG. 7E. Likewise, the method 500 then tries to identify the shortest sequence in the decompressed sequence DCOMP_SEQ starting at the position J=4 that is not an entry in the look-up table. However, since the sequence starting at the position J=4, or "a", is in the table, the method 500 returns back to step 515 for the next iteration without adding an entry to the look-up table as is shown in FIG. 7E.

Figure 7F:
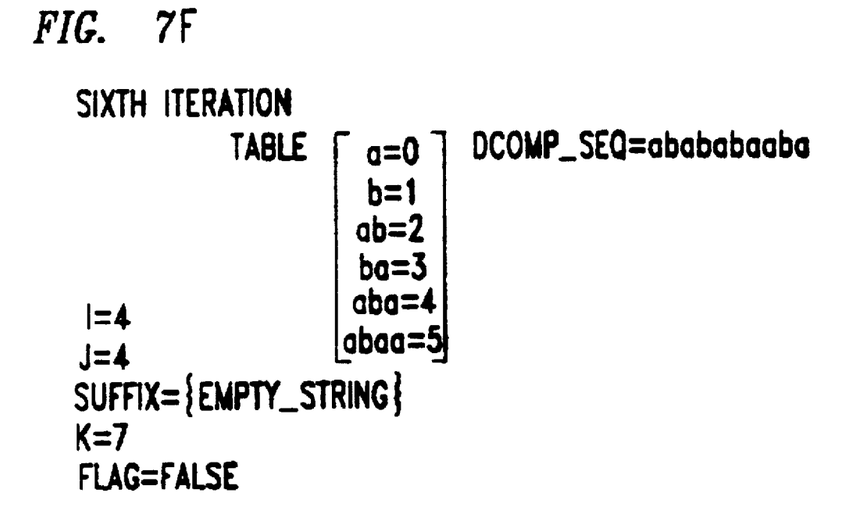

The sixth iteration is performed in substantially the same manner as the first through third iterations. The pointers I and J for the sixth iteration are the sequence locations 4 and 4, respectively. The code at the location I of the compressed code sequence COMP_CODES is also a "4". The entry in the table for a code of "4" is "aba", which is concatenated to the end of the decompressed output sequence DCOMP_SEQ as is shown in FIG. 7F. Further, a new table entry is identified from the sequence DCOMP_SEQ starting from the pointer J=4 which is "abaa" and is entered in the table as entry "5" as is also shown in FIG. 7F. The pointer J is then set to the decompressed sequence location of the pointer K=7 in step 595 prior to starting the next iteration of the method 500.

The seventh and eighth iterations are performed in substantially the same manner as the sixth iteration to produce the decompressed code sequence DCOMP_SEQ= "abababaabaabaaab" which corresponds exactly to the original symbol stream DATA of FIG. 2.

Step 545 removes the temporarily added string SUFFIX from the decompressed sequence DCOMP_SEQ while step 560 then adds the table entry to the decompressed sequence DCOMP_SEQ that was just generated using the concatenated suffix string SUFFIX for illustrations only. It is alternatively possible to combine these steps by leaving the string SUFFIX concatenated at the end of the decompressed sequence DCOMP_SEQ and only add the missing symbols that make up the remainder of the new table string to be added. For example, the added string SUFFIX in the fourth iteration was "ab" and the corresponding new table entry was "aba", therefore, by leaving the string SUFFIX at the end of the decompressed sequence DCOMP_SEQ, only the symbol "a" need be added to effectively add the desired table entry to the sequence DCOMP_SEQ.

Although several embodiments of the invention have been described in detail above, many modifications can be made without departing from the teaching thereof. All of such modifications are intended to be encompassed within the following claims. The "look ahead" features of the compression and decompression methods of the invention are facilitated by the characteristic of each string in the look up table which includes at least two components of a prefix string of symbols and an extension symbol.

Accordingly, it should be readily understood that the particular technique selected to produce such a look-up table is not critical to practicing the invention. The table can be generated in the manner previously described with respect to FIGS. 2 and 6, or by using other techniques, such as those used in the LZ-78 or LZW compression techniques. In addition, such other table building techniques can be techniques typically associated with arithmetic coding schemes such as the schemes described in, for example, D. Lelewer and D. Hirschberg, "Data Compression" ACM Computer Surveys (1987), which is incorporated by reference herein.

The invention claimed is:

1. A method for processing a stream of data symbols into a variable-length compressed code stream comprising:

first parsing said symbol stream and storing in a table strings of symbols encountered in said stream, said stored strings having respective codes associated therewith, each string of symbols containing more than one symbol including a prefix string of symbols and an extension symbol, said prefix string corresponding to a string stored in said table;

second parsing said symbol stream, said second parsing successively partitioning said symbol stream for identifying codes in the table associated with table strings that correspond to the successive partitioning;

said second parsing step determining said successive partitioning by determining the symbol sequence length of a current symbol sequence in the stream when sequences of at least two different lengths correspond to entries in the table for said current sequence based on determining last encountered symbol positions of corresponding next sequences in the stream that correspond to strings in the table and which start at next symbol positions in the stream after said sequences of at least two different lengths; and providing the identified codes in said second parsing step for said compressed code stream.

2. The method of claim 1 wherein a first symbol location of said current sequence is parsed by said first parsing step prior to said second parsing step.

3. The method of claim 1 wherein said first and second parsings are performed substantially simultaneously.

4. The method of claim 3 wherein said first parsing is interleaved with said second parsing.

5. The method of claim 1 wherein said code is provided for the compressed code stream for said current sequence having a length based on a determination that a last symbol of a corresponding next sequence in the symbol stream is at a later encountered stream position than at least one last symbol of a next sequence corresponding to said current sequence having a different length.

6. The method of claim 5 wherein said code is provided for the compressed code stream for said current sequence having a length based on a determination that a last symbol of a corresponding next sequence in the symbol stream is at a relatively latest encountered stream position.

7. The method of claim 1 further comprising initializing said table to include a set of symbols from which the data stream was generated.

8. The method of claim 1 wherein said first parsing is performed according to the Lempil-Ziv-78 technique.

9. The method of claim 1 wherein said first parsing is performed according to the Lempil-Ziv-Welch technique.

10. A method for processing a stream of data symbols into a variable-length compressed code stream comprising:

first parsing said symbol stream and storing in a table strings of symbols encountered in said stream, said stored strings having respective codes associated therewith, each string of symbols containing more than one symbol including a prefix string of symbols and an extension symbol, said prefix string corresponding to a string stored in said table; and second parsing said symbol stream, said second parsing encountering an i-th symbol of said stream after or simultaneously with said first parsing encountering a symbol after a j-th symbol of said stream, wherein i<j, said second parsing comprising, identifying a symbol sequence beginning with a k-th symbol between the i-th and the j-th symbol which corresponds to a previously stored string in the table and which extends to a relatively later encountered symbol in the stream than at least one other symbol sequence corresponding to a previously stored string in the table that starts from a symbol between the i-th to the j-th encountered symbol other than the k-th symbol, identifying the code in the table corresponding to the symbol sequence from the i-th symbol to the symbol immediately prior to the identified k-th symbol, and providing the identified code for part of said compressed code stream.

11. The method of claim 10 wherein the step of identifying a symbol sequence beginning with a k-th encountered symbol identifies the symbol sequence that extends to a relatively latest encountered symbol in the stream.

12. The method of claim 10 wherein said first and second parsings are performed substantially simultaneously.

13. The method of claim 12 wherein said first parsing is interleaved with said second parsing.

14. The method of claim 13 wherein said step of identifying a symbol sequence beginning with a k-th symbol encountered in the stream from the i-th to the j-th symbol is performed immediately after said j-th symbol is processed by said first parsing step.

15. The method of claim 10 wherein said first parsing is performed according to the Lempil-Ziv-78 technique.

16. The method of claim 10 further comprising initializing said table to include a set of symbols from which the data stream was generated.

17. A storage medium manufactured in accordance with a process comprising the steps of:

first parsing a stream of data symbol and storing in a table strings of symbols encountered in said stream, said stored strings having respective codes associated therewith, each said string of symbols including a prefix string of symbols and an extension symbol, said prefix string corresponding to a string stored in said table;

second parsing said symbol stream, said second parsing encountering an i-th symbol of said stream after or simultaneously with said first parsing encountering a symbol after a j-th symbol of said stream, wherein i<j, said second parsing comprising, identifying a symbol sequence beginning with a k-th symbol encountered in the stream from the i-th to the j-th symbol which corresponds to a previously stored string in the table and which extends to a relatively later encountered symbol in the stream than at least one other symbol sequence corresponding to a previously stored string in the table that starts from a symbol between the i-th to the j-th encountered symbol other than the k-th symbol, identifying the code in the table corresponding to the symbol sequence from the i-th symbol to the symbol immediately prior to the identified k-th symbol, and providing the identified code for part of a corresponding compressed code stream;

applying a recording signal to the storage medium, the recording signal representing said codes of said compressed code stream; and recording the recording signal onto the storage medium.

18. The storage medium of claim 17 wherein said storage medium is a CD-ROM.

19. The storage medium of claim 17 wherein said storage medium is a magnetic floppy disk.

20. A method for recovering a stream of data symbols by processing a compressed code stream comprising:

sequentially processing codes encountered in said compressed code stream, said sequentially processing of each code comprising, identifying whether a string entry is present in a table of strings for said code, said table having initial entries of strings of a set of symbols used to generate said stream of symbols, said stored strings having respective codes associated therewith, if said entry is present in said table, a) retrieving the string entry from said table corresponding to said code, b) concatenating the retrieved string to said stream of symbols and c) storing a new string entry in said table with a respective code associated therewith, said new entry corresponding to a shortest sequence in said generated symbol stream not in said table, and if said entry is not present in said table, a) concatenating said immediate previous retrieved string to the end of the stream of symbols at least once to produce an expanded stream of symbols, b) identifying a shortest symbol sequence in said generated expanded symbol stream not in said table, c) storing a new string entry in said table with a respective code associated therewith corresponding to said identified shortest symbol sequence, and d) amending said expanded stream of symbols so as to contain said symbol stream prior to expansion concatenated with said new string entered in said table.

21. The method of claim 20 further comprising initializing said table to include a set of symbols from which the data stream was generated.

* * * * *